United States Patent
Li et al.

(10) Patent No.: US 9,291,688 B2
(45) Date of Patent: Mar. 22, 2016

(54) RADIO FREQUENCY COIL DEVICE AND MAGNETIC RESONANCE IMAGING APPARATUS

(71) Applicants: Weng Ming Li, Shenzhen (CN); Jian Min Wang, Shenzhen (CN); Lan Wang, Shenzhen (CN); Zhi Bin Li, Shenzhen (CN)

(72) Inventors: Weng Ming Li, Shenzhen (CN); Jian Min Wang, Shenzhen (CN); Lan Wang, Shenzhen (CN); Zhi Bin Li, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 414 days.

(21) Appl. No.: 13/781,338

(22) Filed: Feb. 28, 2013

(65) Prior Publication Data

US 2013/0221967 A1    Aug. 29, 2013

(30) Foreign Application Priority Data

Feb. 29, 2012   (CN) ...................... 2012 2 0071323 U

(51) Int. Cl.
*G01R 33/34*      (2006.01)
*G01R 33/3415*    (2006.01)
*G01R 33/36*      (2006.01)

(52) U.S. Cl.
CPC ...... *G01R 33/34092* (2013.01); *G01R 33/3415* (2013.01); *G01R 33/3664* (2013.01)

(58) Field of Classification Search
CPC ........... G01R 33/3415; G01R 33/3664; G01R 33/34092; G01R 33/36
USPC ......................................... 324/309, 318, 322
See application file for complete search history.

(56) References Cited

U.S. PATENT DOCUMENTS

| | | | |
|---|---|---|---|
| 6,414,485 B1 * | 7/2002 | Kato ................... | G01R 33/3415 324/307 |
| 7,205,864 B2 * | 4/2007 | Schultz et al. ................ | 333/104 |
| 2008/0218168 A1 * | 9/2008 | Takagi ........................... | 324/309 |
| 2009/0174498 A1 * | 7/2009 | Xing et al. ..................... | 333/101 |

(Continued)

FOREIGN PATENT DOCUMENTS

| | | | |
|---|---|---|---|
| KR | 1020010051753 A | | 6/2001 |
| WO | WO2009139287 | * | 11/2009 |

OTHER PUBLICATIONS

Google Patents translation of WO 2009/139287.*

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

An RF coil device and an MRI apparatus allowing a connection relationship between input RF channels and output RF channels to be controlled by a smaller number of switch elements are provided. The RF coil device includes multiple coil segments and a multi-selection switch. Input terminals of the multi-selection switch are each connected to a different coil segment. An output terminal of the multi-selection switch leads to an RF output channel. A control terminal of the multi-selection switch is used to receive a control signal so as to select a coil segment for connection to the output terminal. Multiple coil segments connected to the input terminals are not in consecutive positions, and the number of coil segments by which any two of the multiple coil segments are spaced apart is no fewer than the maximum number of coil segments required for one MRI imaging less 1. The MRI apparatus includes the RF coil device.

11 Claims, 6 Drawing Sheets

(56) References Cited

U.S. PATENT DOCUMENTS

| | | | |
|---|---|---|---|
| 2010/0148778 A1* | 6/2010 | Biber | G01R 33/3415 324/318 |
| 2010/0253352 A1* | 10/2010 | Hulbert | 324/318 |
| 2012/0306498 A1* | 12/2012 | Takagi | 324/322 |

OTHER PUBLICATIONS

Korean Office action for related Korean Application No. 10-2013-0021073, dated Oct. 16, 2015.

* cited by examiner

Control output terminal

RF receiving terminal

RADIO FREQUENCY COIL DEVICE AND MAGNETIC RESONANCE IMAGING APPARATUS

This application claims the benefit of CN 201220071323.6, filed on February 29, 2012, which is hereby incorporated by reference.

TECHNICAL FIELD

The present embodiments relate to the technical field of magnetic resonance imaging (MRI).

BACKGROUND

With the rapid development of magnetic resonance imaging (MRI) technology, radio frequency (RF) coil technology, as an indispensable part of MRI technology, has also taken great strides forward (e.g., phased array coils with 8, 16 or even 32 channels). Coils may be divided into three types according to structure: linear coils, orthogonal coils, and phased array coils. A phased array coil includes multiple linear coils or orthogonal coils, each linear coil or orthogonal coil being a coil element. The phased array coil may receive RF pulses of the main magnetic field from multiple directions at the same time, while there are also multiple data acquisition channels matched thereto.

An MRI apparatus includes, for example, an RF coil device and an imaging control device. The RF coil device includes multiple coil sets. Each of the coil sets further includes one or more coil elements. Each coil element transmits RF signals to the imaging control device via an RF channel.

An existing receiver coil channel selection (RCCS) device includes multiple switch elements for controlling a connection relationship between input RF channels (e.g., connected to output RF channels of the coil elements) and output RF channels. For example, if there are 24 coil elements, 24 input RF channels and 16 output RF channels, then the number of switch elements is 16+(24−16)×16=144. See FIG. 1 for the input RF channels and output RF channels controlled by the switch elements. The horizontal axis shows the 24 input RF channels, while the vertical axis shows the 16 output RF channels. x represents a switch element. The number of switch elements used in this solution is quite high.

SUMMARY AND DESCRIPTION

The present embodiments may obviate one or more of the drawbacks or limitations in the related art. For example, a radio frequency (RF) coil device that allows a connection relationship between input RF channels and output RF channels to be controlled by a smaller number of switch elements is provided. An MRI apparatus including the RF coil device is also provided.

In one embodiment, an RF coil device including multiple coil segments and at least one multi-selection switch is provided. Multiple input terminals of the multi-selection switch are each connected to a different coil segment. An output terminal of the multi-selection switch leads to an RF output channel, and a control terminal of the multi-selection switch is used to receive a control signal so as to select a coil segment for connection to the output terminal. Multiple coil segments connected to the multiple input terminals are not in consecutive positions. The fact that the same multi-selection switch is multiplexed for multiple coil selections connected at different times allows the number of multi-selection switches used to be reduced, while also helping to reduce the volume and cost of the RF coil device.

According to one embodiment, the number of coil segments by which any two of the multiple coil segments are spaced apart is no fewer than the maximum number of coil segments used for one MRI imaging less 1.

According to another embodiment, the coil segment includes one or more coil elements. No restrictions are placed on the number of coil elements included in the coil segments. The number of coil elements may be selected according to actual requirements, so the present embodiments are suitable for use in a variety of application scenarios.

According to one embodiment, when the coil segment includes multiple coil elements, RF output terminals of multiple coil elements belonging to the same coil segment are each connected to a different multi-selection switch. In this way, the connection of multiple coil elements in a coil segment to the output terminals of multi-selection switches is controlled by different multi-selection switches, enabling effective control of the connection state of coil elements and effective transmission of RF signals sent by coil elements.

According to another embodiment, when the coil segment includes multiple coil elements, multiple coil elements belonging to the same coil segment use different frequencies to transmit RF signals, and RF output terminals of multiple coil elements belonging to the same coil element are all connected to the same input terminal of the multi-selection switch. In this way, multiplexing of the same multi-selection switch for multiple coil elements in the coil segment is achieved, further reducing the number of multi-selection switches used.

An MRI apparatus is also provided. The MRI apparatus includes the RF coil device. Since the number of switch elements in the RF coil device has already been reduced, the number of switch elements in the MRI apparatus is correspondingly reduced, while the volume of the MRI apparatus may also be reduced.

In one embodiment, the MRI apparatus also includes an imaging control device for sending control signals to the control terminal of the multi-selection switch, so as to select an input terminal in the multi-selection switch for connection to the output terminal. In this way, control of the multi-selection switch by the imaging control device is provided.

DETAILED DESCRIPTION

Figures 1, 2:
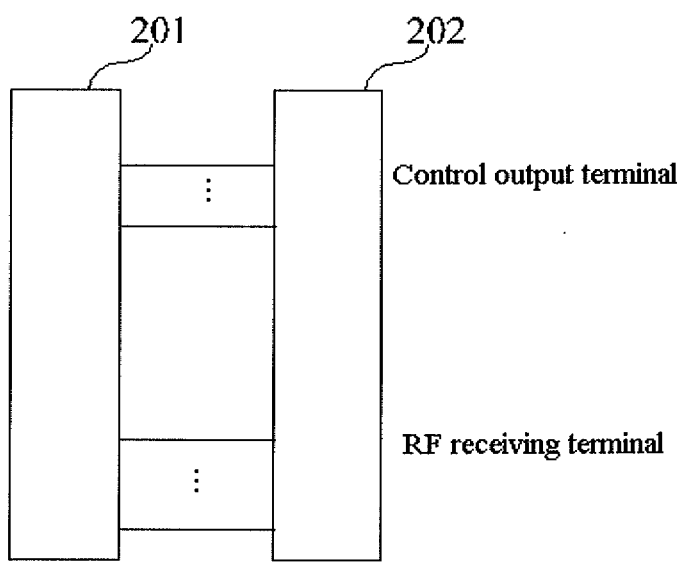
FIG. 1 is a schematic diagram of connecting switch elements between input radio frequency (RF) channels and output RF channels in the prior art.
FIG. 2 shows a structure of one embodiment of a magnetic resonance imaging (MRI) apparatus.

The same labels in the drawings indicate the same parts. In order to show the structure of the various parts and the relationships there between clearly, the proportional relationships amongst the various parts in the drawings are merely schematic, and do not represent the proportional relationships in the actual structure.

FIG. 2 shows one embodiment of a magnetic resonance imaging (MRI) apparatus including a radio frequency (RF) coil device 201 and an imaging control device 202.

Figure 3:
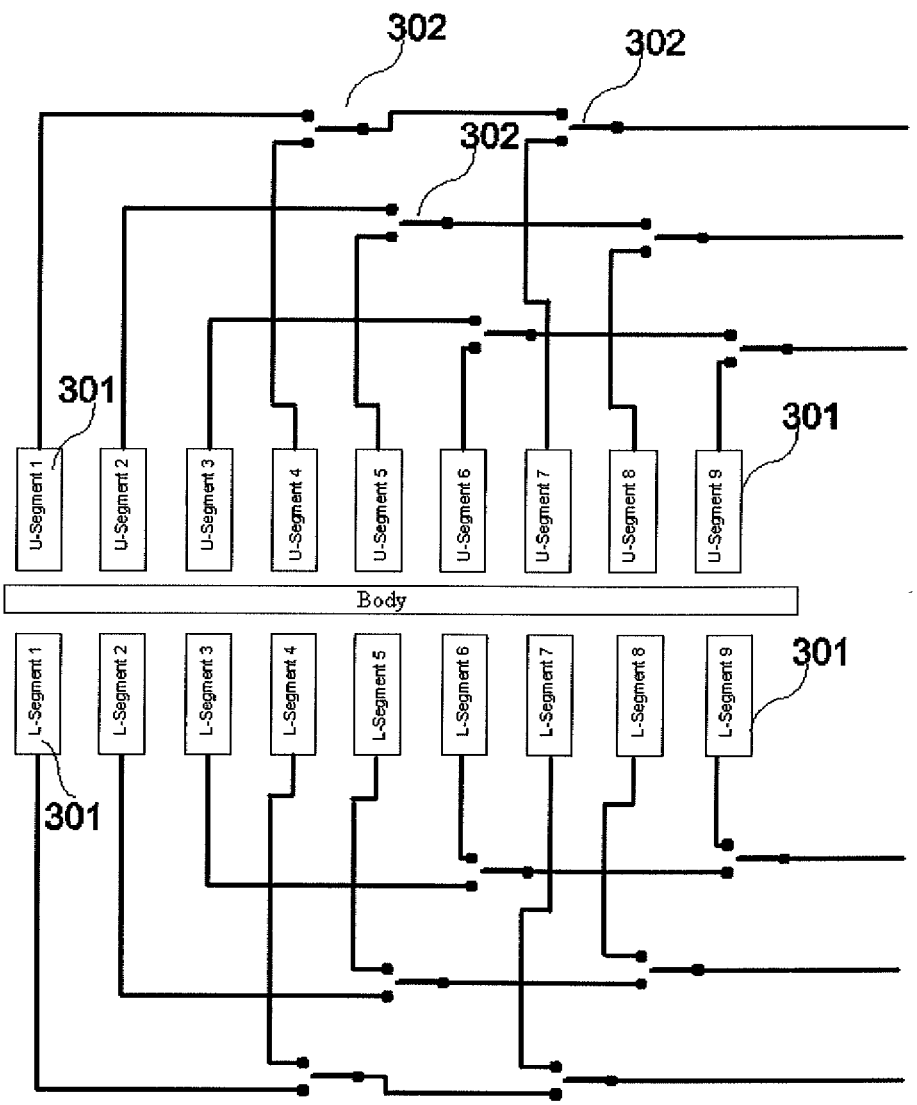
FIG. 3 shows a structure of one embodiment of an RF coil device.

The RF coil device 201 includes multiple coil (CP) segments 301 and at least one multi-selection switch 302, as shown in FIG. 3. Each coil segment 301 includes one or more coil elements. The multi-selection switch 302 includes multiple input terminals, one output terminal and one control terminal (not shown in the drawings). The multiple input terminals are each connected to a different coil segment 301 (e.g., directly, as in the case of the multi-selection switch to the top-left of FIG. 3, or indirectly, as in the case of the multi-selection switch to the top-right of FIG. 3). The one output terminal leads to an RF output channel, and the one control terminal is used to receive a control signal, so as to select a coil segment 301 for connection to the output terminal. The multiple coil segments 301 connected to the multiple input terminals are not in consecutive positions. In one embodiment, the number of coil segments 301 by which any two of the multiple coil segments 301 are spaced apart is no fewer than the maximum number of coil segments required for one magnetic resonance imaging less 1.

The imaging control device 202 includes a control output terminal and an RF receiving terminal. The imaging control device 202 sends control signals to the control terminal of the multi-selection switch 302 via the control output terminal, so as to select an input terminal in the multi-selection switch 302 for connection to the output terminal. The coil segments 301 send RF signals to the RF receiving terminal of the imaging control device 202 through the channel in the multi-selection switch 302.

When the RF coil device 201 is performing a magnetic resonance scan (e.g., a scan of a human body), scanning may be done in segments from the head to the feet. Only a portion of the coil segments 301 are used during one imaging, and the used portion of coil segments 301 are in consecutive positions (e.g., in spatially consecutive positions). The RF channels from the used coil segments 301 to the imaging control device 202 are open during the imaging process. In this embodiment, multiplexing of one multi-selection switch 302 for multiple coil segments 301 is achieved by the fact that the multiple coil segments 301 connected to the multiple input terminals are not in consecutive positions. The number of switch elements is thereby reduced. In one embodiment, the number of coil segments 301 by which any two of the multiple coil segments 301 are spaced apart is no fewer than the maximum number of coil segments used for one magnetic resonance imaging less 1.

If the coil segment 301 includes multiple coil elements, RF output terminals of the multiple coil elements belonging to the same coil segment 301 are each connected to a different multi-selection switch 302. This facilitates overall control of the coil segment 301 and is in conformity with the consecutive coil elements being connected during imaging.

Taking an imaging scan of the human body as an example, there are 9 coil segments 301 from the head to the feet, U-Segment 1 to U-Segment 9. This explanation takes U-Segment 1 to U-Segment 9 in FIG. 3 as an example. The situation is similar for L-Segment 1 to L-Segment 9 in FIG. 3, and will not be repeated superfluously.

Assuming that the maximum number of coil segments used for one imaging is 3, then as scanning proceeds, the connection states of the coil elements 301 are as shown in Table 1:

TABLE 1

| Combination | 1 | 2 | 3 | 4 | 5 | 6 | 7 |
|---|---|---|---|---|---|---|---|
| Coil segments selected | U-segment 1, 2, 3 | U-segment 2, 3, 4 | U-segment 3, 4, 5 | U-segment 4, 5, 6 | U-segment 5, 6, 7 | U-segment 6, 7, 8 | U-segment 7, 8, 9 |

U-segment 1 and U-segment 4, U-segment 2 and U-segment 5, or U-segment 3 and U-segment 6 are not connected at the same time. The same multi-selection switch 302 may thus be multiplexed. The coil segments 301 used in one imaging scan may not have a multiplexed multi-selection switch 302. This embodiment thus provides a method of calculating the number of multi-selection switches 302 used.

The number of multi-selection switches 302 used is:

$$N\_segment - N\_HeadFeet$$

where N_segment represents the total number of coil segments, and N_HeadFeet represents the number of coil segments used for one imaging scan.

Taking into account the fact that the upper part and lower part of the object of scanning is to be scanned separately during an imaging scan (e.g., in the case of the human body, the face and chest are included in the upper part, while the back is included in the lower part), the total number of coil segments is to be multiplied by 2, and the number of multi-selection switches 302 is then:

$$2 \times (N\_segment - N\_HeadFeet).$$

If each coil segment includes the same number of multiple coil elements, the number of multi-selection switches 302 used is:

$$2 \times N\_LeftRight \times (N\_segment - N\_HeadFeet),$$

where N_LeftRight represents the number of coil elements included in one coil segment.

Taking FIG. 3 as an example, the total number of coil segments is 9, the number of coil segments used for one imaging scan is 3, and the number of coil elements included in one coil segment is 3. Accordingly, the number of multi-selection switches used is: $2 \times 3 \times (9-3) = 36$. If the solution presented in the background section is used, the number of input RF channels is $2 \times 3 \times 9 = 54$, the number of output RF channels is $2 \times 3 \times 3 = 18$. Accordingly, the number of multi-selection switches required is: $(54-18) \times 18 + 18 = 666$. The 36 multi-selection switches of this embodiment represent a vast reduction in number compared to the 666 switch elements of the background.

Table 2 below expresses, in a more direct way, the relationship between the total number of coil segments, the number of coil elements included in one coil segment 301 and the number of multi-selection switches used.

TABLE 2

| Number of multi-selection switches required | | | | |
|---|---|---|---|---|
| | | Total number of coil segments | | |
| | | 3 | 4 | 5 |
| Number of coil elements in one coil segment | 3 | 18 | 24 | 30 |
| | 4 | 24 | 32 | 40 |
| | 5 | 30 | 40 | 50 |

According to another embodiment, the coil segment 301 includes multiple coil elements. The multiple coil elements in one coil segment 301 transmit RF signals using different frequencies, so that the RF output terminals of the multiple coil elements in one coil segment 301 may all be connected to the same input terminal of one multi-selection switch 302. The number of multi-selection switches 302 used is: 2×(N_segment−N_HeadFeet). Taking FIG. 3 as an example, the number of multi-selection switches 302 used may be reduced to 12.

Figure 4:
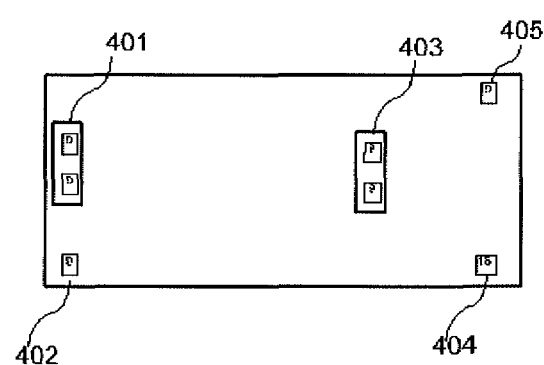
FIG. 4 is a schematic diagram of one embodiment of patient table sockets.

According to another embodiment, coil segments for upper and lower parts may be combined in an asymmetric manner, owing to the relationships amongst sockets to which the coil segments are connected. Taking a scan of the human body as an example, the sockets to which coil segments correspond are distributed on a patient table (PTAB), as shown in FIG. 4. Taking the example of each coil segment 301 including 3 coil elements, the head/neck section 401 corresponds to one socket, and uses 3 coil segments 301 at both the upper part and the lower part (e.g., 9 coil elements). The chest section 402 corresponds to one socket and is included in the upper part, using 3 coil segments 301 (e.g., 9 coil elements). The spine section 403 corresponds to two sockets and is included in the lower part, using 6 coil segments 301. For convenience of connection to the socket, the 6 coil segments 301 may be split into two groups, each group having 9 coil elements. The abdomen section and upper half surface of the legs 404 correspond to one socket and are included in the upper part, using 6 coil segments 301 (e.g., 18 coil elements). The lower half surface of the legs 405 corresponds to one socket and is included in the lower part, using 3 coil segments 301 (e.g., 9 coil elements).

Figure 5:
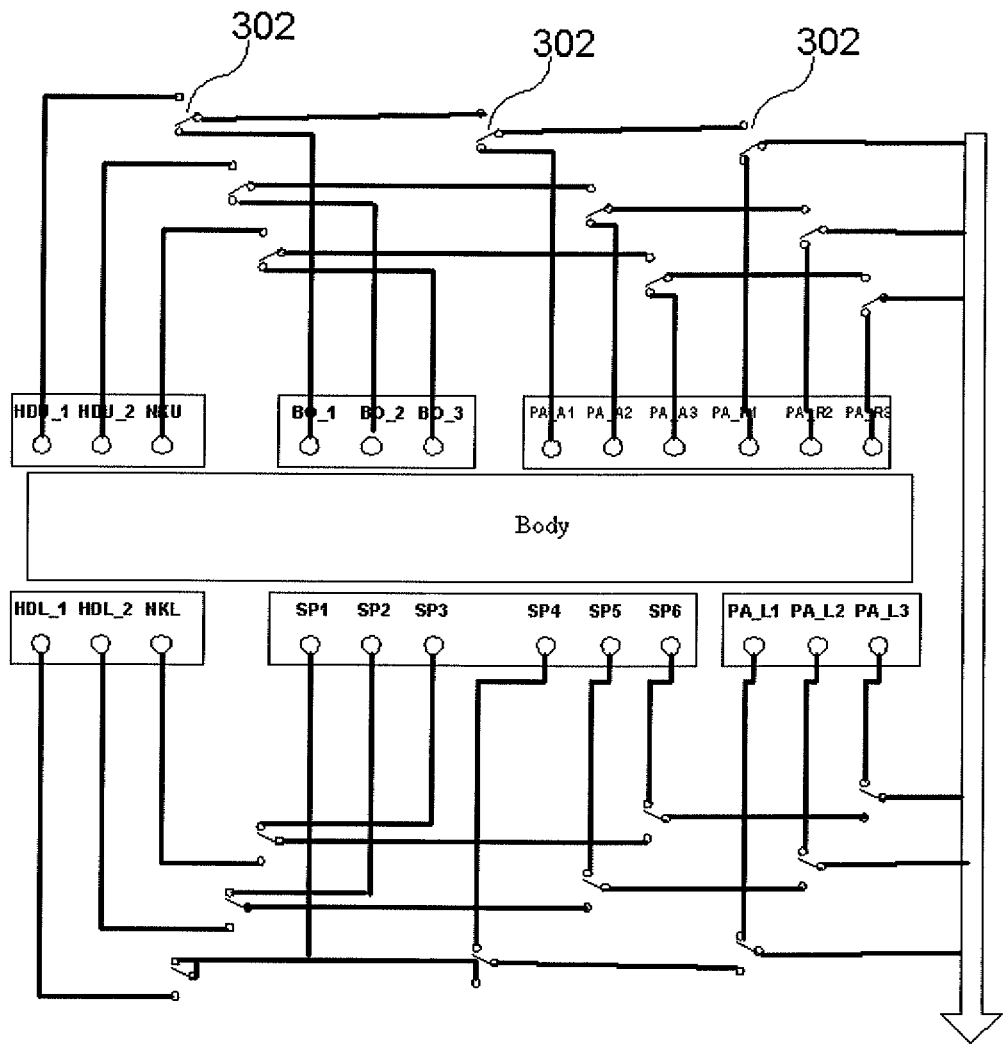
FIG. 5 shows a structure of one embodiment of the RF coil device.
Figure 6:
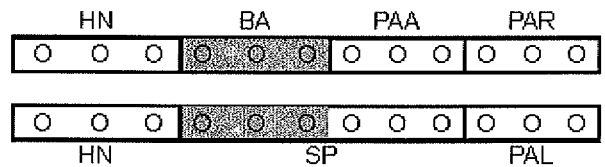
FIGS. 6-15 are schematic diagrams showing embodiments of combinations of simultaneously connected coil segments.
Figure 7:
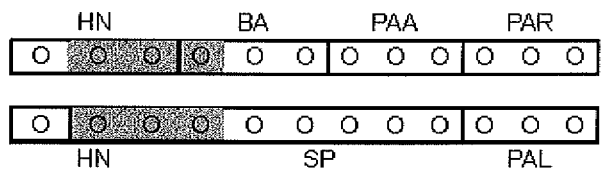
Figure 8:
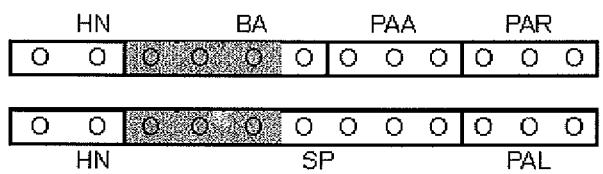
Figure 9:
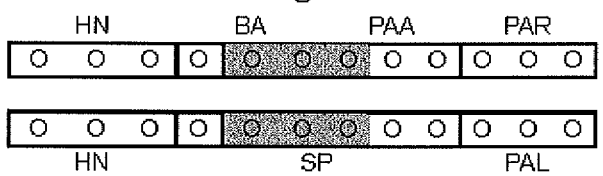
Figure 10:
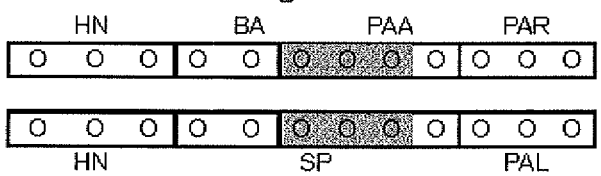
Figure 11:
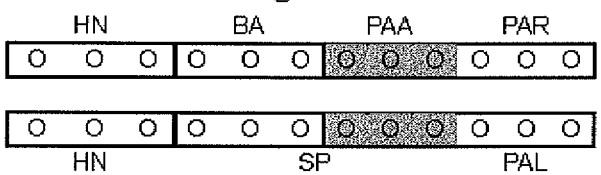
Figure 12:
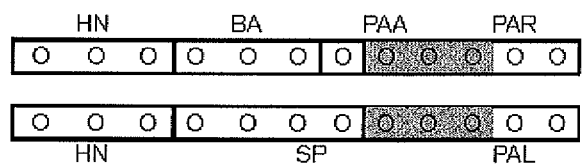
Figure 13:
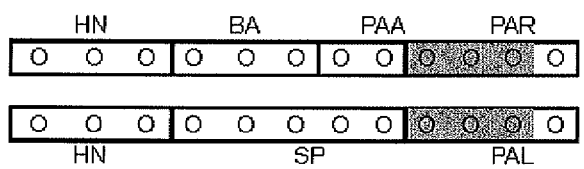
Figure 14:
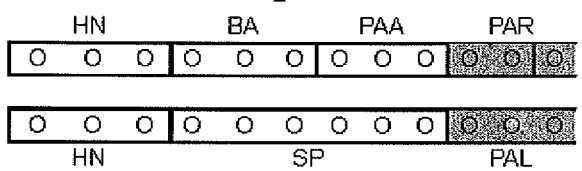
Figure 15:
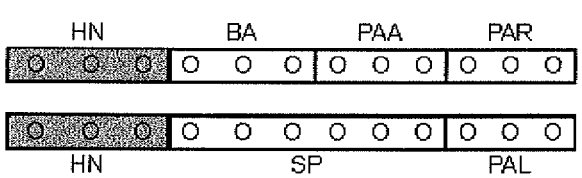

Corresponding to FIG. 4, FIG. 5 shows the sequential relationships among the coil segments 301 and multi-selection switches 302. The coil segments 301 included in the upper part of the head/neck section 401 include HDU_1, HDU_2 and NKU, while the coil segments 301 included in the lower part of the head/neck section 401 include HDL_1, HDL_2 and NKL. The coil segments 301 included in the chest section 402 include BO_1, BO_2 and BO_3. The coil segments 301 included in the abdomen section include PA_A1, PA_A2 and PA_A3. The coil segments 301 included in the upper half surface of the legs include PA_R1, PA_R2 and PA_R3. The coil segments 301 included in the spine section 403 include SP1-SP6. The coil segments 301 included in the lower half surface of the legs 405 include PA_L1, PA_L2 and PA_L3. The output terminals of the multi-selection switches 302 are connected to an RF signal receiver (i.e., connected to the RF receiving terminal in the imaging control device 202 (e.g., a coax pin interface)).

Coil segments 301 are connected simultaneously in the following combinations:
1. BO_1+BO_2+BO_3+SP1+SP2+SP3
2. HDU_2+NKU+BO_1+HDL_2+NKL+SP1
3. NKU+BO_1+BO_2+NKL+SP1+SP2
4. BO_2+BO_3+PA_A1+SP2+SP3+SP4
5. BO_3+PA_A1+PA_A2+SP3+SP4+SP5
6. PA_A1+PA_A2+PA_A3+SP4+SP5+SP6
7. PA_A2+PA_A3+PA_R1+SP5+SP6+PA_L1
8. PA_A3+PA_R1+PA_R2+SP6+PA_L1+PA_L2
9. PA_R1+PA_R2+PA_R3+PA_L1+PA_L2+PA_L3
10. HDU_1+HDU_2+NKU+HDL_1+HDL_2+NKL FIGS. 6-15 show pictorial examples corresponding to these 10 combinations. HN corresponds to the head/neck section 401, BA corresponds to the chest section 402, SP corresponds to the spine section 403, PAA corresponds to the abdomen section, PAR corresponds to the upper half surface of the legs, and PAL corresponds to the lower half surface of the legs 405. Each little circle in FIGS. 6-15 represents a coil segment 301. The 3 coil segments 301 covered by the shaded region are the coil segments 301 selected during one imaging scan, and are also the coil segments 301 with corresponding RF channels that are in a connected state. The RF channels corresponding to the other unselected coil segments 301 are in a disconnected state.

If the solution presented in the background section is used, 72 input RF channels and 18 output RF channels are used, so that the total number of switch elements used is (72−18)×18+18=990. By contrast, the number of multi-selection switches 302 used in this embodiment is 3×(12−3)+3×(12−3)=54, significantly less than 990.

For the case where the coil segments for upper and lower parts are combined asymmetrically, the method provided in this example for calculating the number of multi-selection switches 302 used is N_LeftRight×(N_segment_upper−N_HeadFeet)+N_LeftRight×(N_segment_lower−N_HeadFeet). N_segment_upper represents the total number of coil segments in the upper part, and N_segment_lower represents the total number of coil segments in the lower part.

In the embodiments, the same multi-selection switch is multiplexed for multiple coil segments connected at different times, thus enabling the number of multi-selection switches to be reduced, while also helping to reduce the volume and cost of the RF coil device.

In one embodiment, an RF coil device and an MRI apparatus allowing the connection relationship between input RF channels and output RF channels to be controlled by a smaller number of switch elements are provided. The RF coil device includes multiple coil segments 301 and a multi-selection switch 302. Multiple input terminals of the multi-selection switch 302 are each connected to a different coil segment 301. An output terminal of the multi-selection switch 302 leads to an RF output channel, and a control terminal of the multi-selection switch 302 is used to receive a control signal so as to select a coil segment 301 for connection to the output terminal. Multiple coil segments 301 connected to the multiple input terminals are not in consecutive positions, and the number of coil segments 301 by which any two of the multiple coil segments 301 are spaced apart is no fewer than the maximum number of coil segments used for one MRI imaging less 1. The MRI apparatus includes the RF coil device.

The present invention has been presented and explained in detail above by way of accompanying drawings and embodiments. However, the present invention is not limited to these disclosed embodiments. Other solutions inferred by those skilled in the art also fall within the scope of protection of the present invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A radio frequency coil device comprising:
   multiple coil segments;
   a plurality of multi-selection switches, each multi-selection switch comprising multiple input terminals, each input terminal being connected to a different coil segment of the multiple coil segments, wherein each multi-selection switch is configured to be multiplexed between the multiple input terminals such that only one input terminal and connected coil segment is configured to be selected at a time; and
   a control terminal of each multi-selection switch operable to receive a control signal so as to select an input terminal of the multiple input terminals for connection to an output terminal of the respective multi-selection switch,
   wherein the multiple coil segments connected to the multiple input terminals of each respective multi-selection switch are not in consecutive positions.

2. The radio frequency coil device as claimed in claim 1, wherein any two coil segments connected to a same multi-selection switch are spaced apart by at least n−1 consecutive coil segments of the radio frequency coil device, where n is a maximum number of coil segments required for a single magnetic resonance image.

3. The radio frequency coil device as claimed in claim 1, wherein the multiple coil segments comprise one coil element.

4. The radio frequency coil device as claimed in claim 1, wherein the multiple coil segments comprise multiple coil elements, and
   wherein radio frequency output terminals of the multiple coil elements belonging to a same coil segment are each connected to a different multi-selection switch of the plurality of multi-selection switches.

5. The radio frequency coil device as claimed in claim 1, wherein each coil segment of the multiple coil segments comprises multiple coil elements, the multiple coil elements belonging to a respective coil segment using different frequencies to transmit RF signals, RF output terminals of the multiple coil elements being connected to one of the input terminals of the respective multi-selection switch.

6. A magnetic resonance imaging apparatus comprising:
   a radio frequency coil device comprising:
      multiple coil segments;
      a plurality of multi-selection switches, each multi-selection switch comprising multiple input terminals, each input terminal being connected to a different coil segment of the multiple coil segments, wherein each multi-selection switch is configured to be multiplexed between the multiple input terminals such that only one input terminal and connected coil segment is configured to be selected at a time; and
      a control terminal of each multi-selection switch operable to receive a control signal so as to select an input terminal of the multiple input terminals for connection to an output terminal of the respective multi-selection switch,
      wherein the multiple coil segments connected to the multiple input terminals of each respective multi-selection switch are not in consecutive positions.

7. The magnetic resonance imaging apparatus as claimed in claim 6, further comprising an imaging control device operable to send control signals to the control terminal of the respective multi-selection switch, so as to select one of the input terminals in the multi-selection switch for connection to the output terminal.

8. The radio frequency coil device as claimed in claim 6, wherein any two coil segments connected to a same multi-selection switch are spaced apart by at least n−1 consecutive coil segments of the radio frequency coil device, where n is a maximum number of coil segments required for a single magnetic resonance image.

9. The magnetic resonance imaging apparatus as claimed in claim 6, wherein the multiple coil segments comprise one coil element.

10. The magnetic resonance imaging apparatus as claimed in claim 6, wherein the multiple coil segments comprise multiple coil elements, and
    wherein radio frequency output terminals of the multiple coil elements belonging to a same coil segment are each connected to a different multi-selection switch of the plurality of multi-selection switches.

11. The magnetic resonance imaging apparatus as claimed in claim 6, wherein each coil segment of the multiple coil segments comprises multiple coil elements, the multiple coil elements belonging to a respective coil segment using different frequencies to transmit RF signals, RF output terminals of the coil elements being connected to one of the input terminals of the respective multi-selection switch.

* * * * *